United States Patent
Chen et al.

(10) Patent No.: US 8,451,060 B2
(45) Date of Patent: May 28, 2013

(54) AMPLIFIER DEVICE

(75) Inventors: Ji-Ting Chen, Hsinchu County (TW); Roger Randolph Wang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 91 days.

(21) Appl. No.: 13/222,263

(22) Filed: Aug. 31, 2011

(65) Prior Publication Data

US 2012/0146729 A1    Jun. 14, 2012

(30) Foreign Application Priority Data

Dec. 9, 2010 (TW) ................................ 99143114 A

(51) Int. Cl.
*H03F 1/14* (2006.01)
(52) U.S. Cl.
USPC .......................................... 330/292; 330/255
(58) Field of Classification Search
USPC .................. 330/292, 253, 257, 260, 261, 255
See application file for complete search history.

(56) References Cited

U.S. PATENT DOCUMENTS

| | | | |
|---|---|---|---|
| 6,828,855 B1 * | 12/2004 | Wang | 330/253 |
| 7,330,074 B2 * | 2/2008 | Kang et al. | 330/255 |
| 8,044,950 B2 * | 10/2011 | Satou | 345/211 |

* cited by examiner

*Primary Examiner* — Henry Choe
(74) *Attorney, Agent, or Firm* — Rabin & Berdo, P.C.

(57) ABSTRACT

An amplifier device including a gain stage, an output stage, at least one phase compensation circuit and at least one coupling suppression device is provided. The gain stage has at least one feedback node. The output stage is coupled to the gain stage and has an output node for outputting an output voltage. Each of the at least one phase compensation circuit is coupled between a corresponding one of the at least one feedback node and the output node. Each of the at least one coupling suppression device is coupled between a corresponding one of the at least one feedback node and a respective coupling node, and is spontaneously turned on in response to a change of a voltage level at the corresponding feedback node when the corresponding feedback node is coupled by noise, thereby suppressing the change of the voltage level at the corresponding feedback node.

16 Claims, 7 Drawing Sheets

210

212

AMPLIFIER DEVICE

This application claims the benefit of Taiwan application Serial No. 99143114, filed Dec. 9, 2010, the subject matter of which is incorporated herein by reference.

BACKGROUND OF THE INVENTION

1. Field of the Invention

The invention relates in general to an amplifier device, and more particularly to an amplifier device capable of suppressing noise coupling.

2. Description of the Related Art

During operation of a conventional amplifier, external noise may often enter the output end and pass through one or more internal phase compensation circuits within the amplifier to be coupled to other internal parts of the amplifier, resulting in unexpected phenomena such as abnormal current leakage, abnormal output waveform and abnormal operation.

Referring to FIG. 1A, a circuit diagram of a conventional amplifier is shown. The conventionally amplifier is, for example, used in the sample-and-hold circuit or the source driver of a liquid crystal display. If the voltage at a loading end Out changes (that is, external noise occurs), external noise entering the loading end Out will pass through an output switch S1 to be coupled to an output end of the amplifier device 100. Then, the coupled noise enters the internal loop and passes through an internal phase compensation circuit 102 or 104 to be coupled to other internal parts of the amplifier device 100. Thus, abnormal current leakage or abnormal waveform will occur at the loading end Out.

Referring to FIG. 1B, a signal timing diagram of the amplifier circuit 100 of FIG. 1A explains how the external noise causes the aforementioned abnormal phenomena to the amplifier device 100. When the input voltage Vin of the amplifier device 100 changes to a high level from a low level, the switch S1 will be temporarily turned off (OFF), and the interior of the amplifier device 100 will follow the high level of the input signal through a close loop and become locked. Consequently, the voltage Vout at the output end is boosted, but the voltage at the loading end Out still remains at the low level because the switch S1 is already turned off.

Then, the switch S1 will be turned on (changing to the ON state from the OFF state), leading to redistribution of charges between the output end and the loading end Out. The voltage level of the output voltage Vout is then lowered down, further pulling down the voltage levels of the feedback nodes N1 and N2 of the internal phase compensation circuits 102 and 104 of the amplifier device 100 via coupling. Responsively, the transistor M14 is turned off, so that the current of the transistor M15 is boosted but the current of the transistor M16 is lowered down. As a result, the output voltage Vout is boosted, and it returns to its original level to continue to charge the loading end Out.

However, when the amplifier device 100 continues to charge the loading end Out, a second coupling (noise) occurs and results in abnormal phenomena. In greater details, when the amplifier device 100 charges the loading end Out and boosts the voltage level at the loading end Out, the voltages at the node N1 and N2 will be boosted due to the second coupling (designated by the dotted line region in the left hand side of FIG. 1B), which further causes the transistor M12 to be turned off. Thus, the current of the transistor M16 will increase, that is, extra current leakage occurs to the DC current flowing through the transistors M15 and M16. As a result, the waveform of the loading voltage Out experiences abnormal drop during the charging period, and the charging speed will slow down. As indicated in FIG. 1B, during the period when Vin is at a high level, the actual waveforms (designated in solid lines) of the output voltage Vout and the loading voltage at the loading end Out are abnormal with respect to the ideal waveform (designated in dotted lines).

Likewise, after the input voltage Vin changes to a low level from a high level and the switch S1 is turned on (changing to the ON state from the OFF state), the amplifier device 100 discharges the loading end Out, causing the voltages at the nodes N1 and node N2 (designated by the dotted line region in the right hand side of FIG. 1B) to be lowered down due to noise coupling, which further causes the transistor M10 to be turned off. Thus, the current of the transistor M15 will be boosted, that is, extra current leakage occurs to the DC current flowing through the transistors M15 and M16. As a result, the waveform of the loading voltage at the loading end Out will experience abnormal increase during the discharging period, and the discharging speed will slow down. As indicated in FIG. 1B, during the period when Vin is at a low potential, the actual waveforms (designated in solid lines) of the output voltage Vout and loading voltage at the loading end Out are abnormal with respect to the ideal waveform (designated in dotted lines).

Apart from the external noise occurring when the input voltage changes and the loading end is charged/discharged, any other type of external interference noise coming from the environment may also be coupled to the feedback node N1 or N2 of the amplifier through the output end and the phase compensation circuit 102 or 104 and result in abnormal circuit operations.

To summarize, the conventional amplifier may often experience abnormal output waveform, abnormal current leakage, and abnormal circuit operation when an external signal or noise is coupled to the phase compensation circuit and causes interference to the operation of other internal parts of the amplifier.

SUMMARY OF THE INVENTION

The invention is directed to an amplifier device, which has a mechanism for suppressing external noise coupling, hence capable of avoiding the problems of abnormal output waveform and abnormal operation current caused by external noise in the prior art.

In an embodiment, at least one coupling suppression device is added to a conventional amplifier device. Each of the at least one coupling suppression device is coupled between a feedback node of a phase compensation circuit inside the amplifier device and a coupling node. Preferably, the coupling node can be implemented as any node inside the amplifier device with a voltage level close to the DC level of the feedback node. When the feedback node of the phase compensation circuit is coupled by noise, the coupling suppression device will be turned on so as to suppress the change of the voltage level at the feedback node, hence avoiding the problems of abnormal output waveform and abnormal operation current in the prior art.

According to an embodiment, an amplifier device including a gain stage, an output stage, at least one phase compensation circuit and at least one coupling suppression device is provided. The gain stage has at least one feedback node. The output stage is coupled to the gain stage and has an output node for outputting an output voltage. Each of the at least one phase compensation device is coupled between a corresponding one of the at least one feedback node and the output node. Each of the at least one coupling suppression device is coupled between a corresponding one of the at least one feedback node and a respective coupling node, and is spontaneously turned on in response to change of a voltage level at the corresponding feedback node when corresponding feedback node is coupled by noise, so that the change of the voltage level at the corresponding feedback node is suppressed.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 2A:
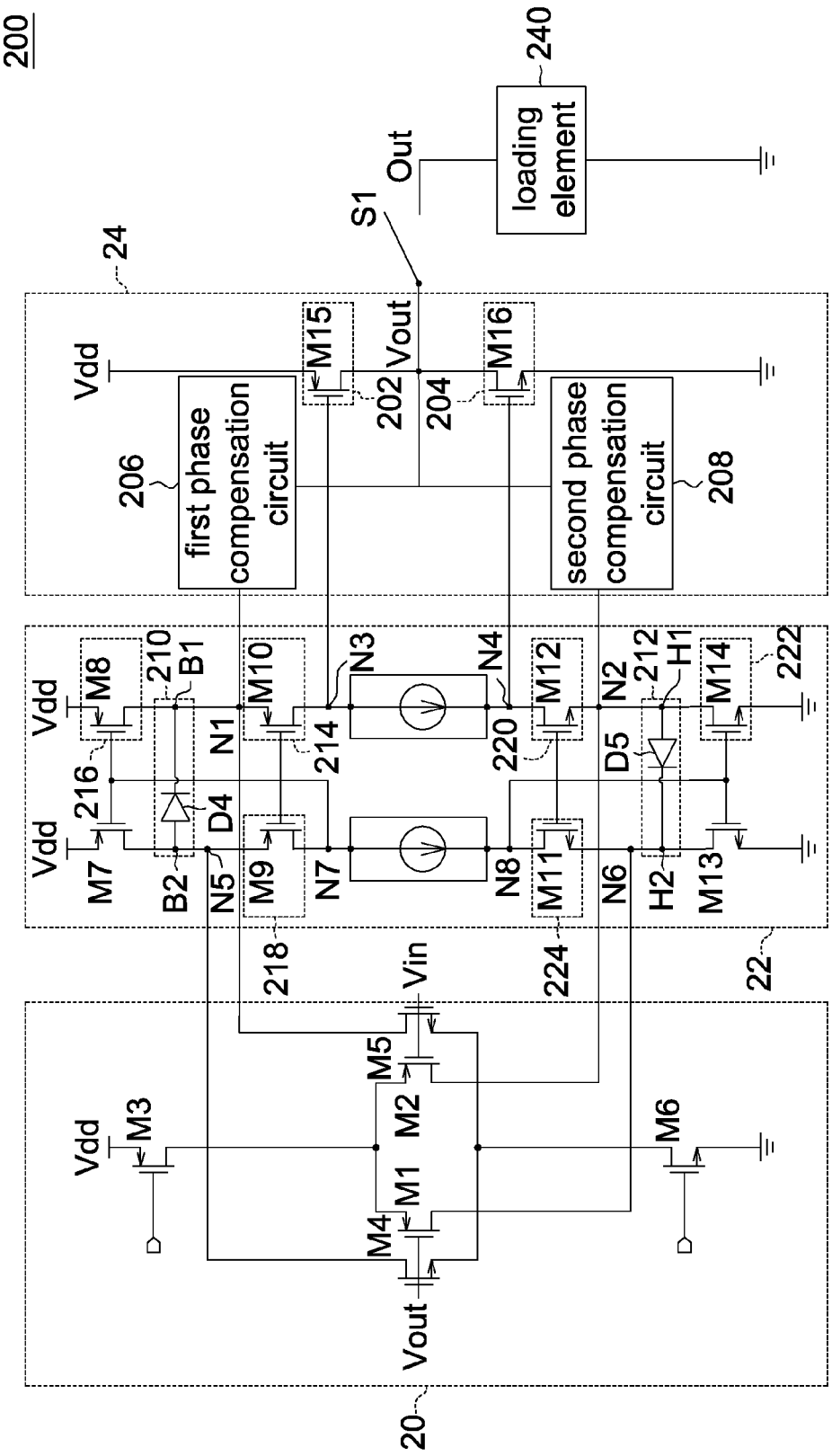
FIG. 2A shows a block structure and detailed circuit diagram of an amplifier device according to a first embodiment.

Referring to FIG. 2A, a block structure and detailed circuit diagram of an amplifier device 200 according to a first embodiment is shown. As indicated in FIG. 2A, the amplifier device 200 includes an input stage 20 for receiving a differential input voltage Vin, a gain stage 22 coupled to the input stage 20 for amplifying the output of the input stage 20, and an output stage 24 for generating an output voltage Vout according to the output of the gain stage 20. In addition, the output node (Vout) can be coupled to a loading element 240 through a switch element 51. In the present embodiment, an input node of the input stage 20 is coupled to the output node (Vout), so that the amplifier device 200 forms a unit gain buffer or a voltage follower.

Furthermore, the amplifier device 200 includes a first phase compensation circuit 206 and a second phase compensation circuit 208, wherein the first phase compensation circuit 206 can be coupled between the first feedback node N1 of the gain stage 22 and the output node (Vout) of the output stage 24. Likewise, the second phase compensation circuit 208 can be coupled between the second feedback node N2 of the gain stage 22 and the output node (Vout) of the output stage 24.

Figure 1A:
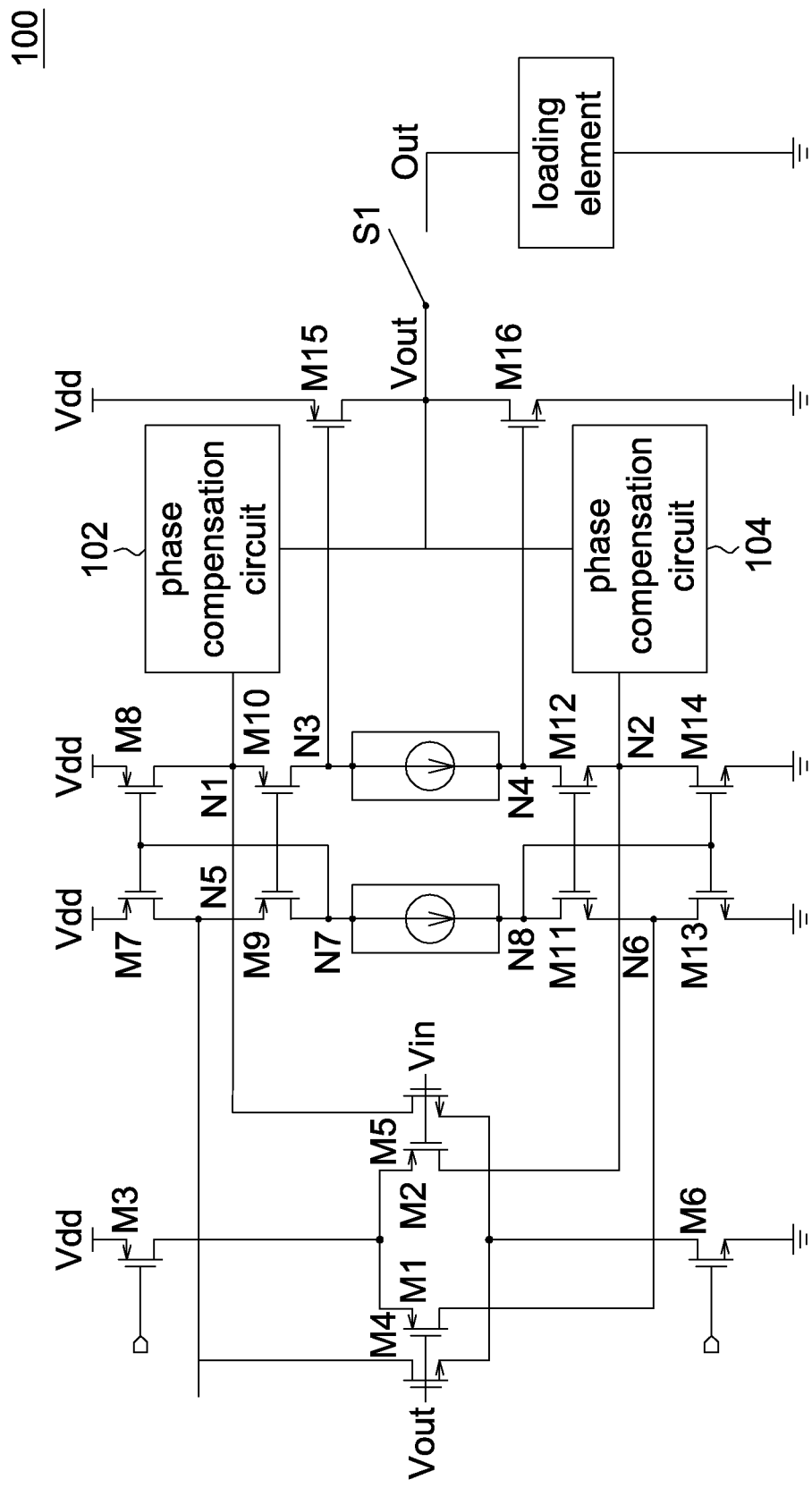
FIG. 1A shows a circuit diagram of a conventional amplifier.

In addition, the amplifier device 200 further includes a first coupling suppression device 210 and a second coupling suppression device 212. The first coupling suppression device 210 is directly or indirectly coupled between the first feedback node N1 and a first coupling node N5. Likewise, the second coupling suppression device 212 is directly or indirectly coupled between the second feedback node N2 and a second coupling node N6. In comparison to the conventional amplifier device 100 of FIG. 1A, the amplifier device 200 is additionally equipped with the first and the second coupling suppression devices 210 and 212.

The first coupling suppression device 210 and the second coupling suppression device 212 are for suppressing noise entering the output node (Vout) and passing through the first and the second phase compensation circuits 206 and 208 to be coupled to the first and the second feedback nodes N1 and N2, so as to avoid abnormal output waveform and abnormal current leakage. For example, such type of noise may occur during the level transition period of the output voltage Vout.

When noise occurring to the output node (Vout) is coupled to the first feedback node N1, causing the voltage level at the first feedback node N1 to be lowered down, the first coupling suppression device 210 starts to be turned on in response to the level change and forms a charging path, through which a compensation current flows for charging the first feedback node N1, so that the voltage level at the first feedback node N1 is boosted pulled up and the noise is suppressed.

Likewise, when noise occurring to the output node (Vout) is coupled to the second feedback node N2 and causing the voltage level at the first feedback node N2 to be boosted, the second coupling suppression device 212 starts to be turned on in response to the level change and forms a discharging path in which a compensation current flows for discharging the second feedback node N2, so that the voltage level at the second feedback node N2 is lowered down and the noise is suppressed.

In a preferred embodiment, to prevent the normal operation of the amplifier device 200 from being affected by the coupling suppression devices 210 and 210, the ON/OFF of the coupling suppression devices 210 and 210 is controlled by their voltage drops (that is, the voltage drop between the feedback node N1/N2 and coupling node N5/N6). That is, when the voltage drop between the feedback node N1/N2 and the coupling node N5/N6 is lower than a predetermined voltage, the coupling suppression device 210/212 is turned off, thus not affecting the voltage level at the feedback node N1/N2. Only when the voltage level at the feedback node N1/N2 is boosted so that the voltage drop between the feedback node N1/N2 and the coupling node N5/N6 is higher than or equal to the predetermined voltage will the coupling suppression device 210/212 start to be turned on to perform the function of coupling suppression.

To achieve the above operation, the first coupling node N5 can be implemented by a node whose DC level is close to the DC level of the first feedback node N1, and the second coupling node N6 is implemented by a node whose DC level is close to the DC level of the second feedback node N2. Thus, in the normal state when there is no noise, the voltage drop between the feedback node N1/N2 and the coupling node N5/N6 is not higher than the predetermined voltage or even almost equal to zero, so the coupling suppression device 210/212 is turned off. After the noise is coupled to the feedback node N1/N2 to increase the voltage drop between the feedback node N1/N2 and the coupling node N5/N6 to reach the predetermined voltage, the coupling suppression device 210/212 starts to be turned on to perform the function of noise suppression.

Referring to FIG. 2A, a block structure and detailed circuit diagram of an amplifier device 200 according to a first embodiment is shown. FIG. 2A explains how the first and the second coupling suppression devices 210 and 212 suppress the noise. The detailed circuit diagram of FIG. 2A is for exemplification only, and various detailed circuits can adopt at least one coupling suppression device to implement noise coupling suppressing mechanism in a similar manner.

As indicated in FIG. 2A, the output stage 24 includes a first output switch 202 and a second output switch 204, which are serially coupled at the output node (Vout). The first output switch 202 includes a first output transistor M15 implemented by such as a P-type metal oxide semiconductor (PMOS) transistor. The second output switch 204 includes a second output transistor M16 implemented by such as an N-type metal oxide semiconductor (NMOS) transistor. The drain of the first output transistor M15 is coupled to the output node (Vout), and the source of the first output transistor M15 is coupled to the first operational voltage Vdd. Likewise, the drain of the second output transistor M16 is coupled to the output node (Vout), and the source of the second output transistor M16 is coupled to the second operational voltage (such as GND).

The gain stage 22 mainly includes a first switch 214, a second switch 216, a third switch 218, a fourth switch 220, a fifth switch 222 and a sixth switch 224. For example, the first, the second and the third switches 214, 216 and 218 include a first transistor M10, a second transistor M8 and a third transistor M9 respectively, wherein these transistors are implemented by such as a P-type metal oxide semiconductor transistor respectively. The drain (the node N3) of the first transistor M10 is coupled to the gate of the first output transistor M15, and the source of the first transistor M10 is coupled to the first feedback node N1. The drain of the second transistor M8 is coupled to the first feedback node N1, and the source of the second transistor M8 is coupled to the first operational voltage Vdd. The drain (the node N7) of the third transistor M9 is coupled to the gate of the second transistor M8, and the gate is coupled to the gate of the first transistor M10.

For example, the fourth, the fifth, and the sixth switches 220, 222 and 224 include a fourth transistor M12, a fifth transistor M14 and a sixth transistor M11 respectively, wherein these transistors are implemented by such as an N-type metal oxide semiconductor transistor respectively. The drain (the node N4) of the fourth transistor M12 is coupled to the gate of the second output transistor M16, and the source of the fourth transistor M12 is coupled to the second feedback node N2. The drain of the fifth transistor M14 is coupled to the second feedback node N2, and the source of the fifth transistor M14 is coupled to the second operational voltage GND. The drain (the node N8) of the sixth transistor M11 is coupled to the gate of the fifth transistor M14, and the gate of the sixth transistor M11 is coupled to the gate of the fourth transistor M12.

In the present embodiment, the first and the second coupling suppression devices 210 and 212 can be implemented as PN diodes D4 and D5. The cathode B1 of the PN diode D4 is coupled to the first feedback node N1, and the anode B2 is coupled to the source (the first coupling node N5) of the third transistor M9. The anode H1 of the PN diode D5 is coupled to the second feedback node N2, and the cathode is coupled to the source (the second coupling node N6) of the transistor M11.

The operation principles of the first and the second coupling suppression devices 210 and 212 disclosed above are elaborated below. When the amplifier device 200 is in the normal state, due to the symmetry of the circuits, the voltage Vn1 at the first feedback node N1 is close to the voltage Vn5 at the first coupling node N5, and the voltage difference between the two ends of the diode D4 (=Vn5−Vn1) is smaller than the turn-on voltage Vt (such as 0.7V), so that the diode D4 is not turned on. Likewise, due to the symmetry of the circuits, the voltage Vn2 at the second feedback node N2 is close to and the voltage Vn6 at the second coupling node N6, the voltage difference between the two ends of the diode D5 (=Vn2−Vn6) is also smaller than the turn-on voltage (such as 0.7V), so that the second coupling suppression device 212 is not turned on. As a result, during DC response, both the coupling suppression devices 210 and 212 are not turned on and will not affect the normal operation of the amplifier device 200.

Figure 1B:
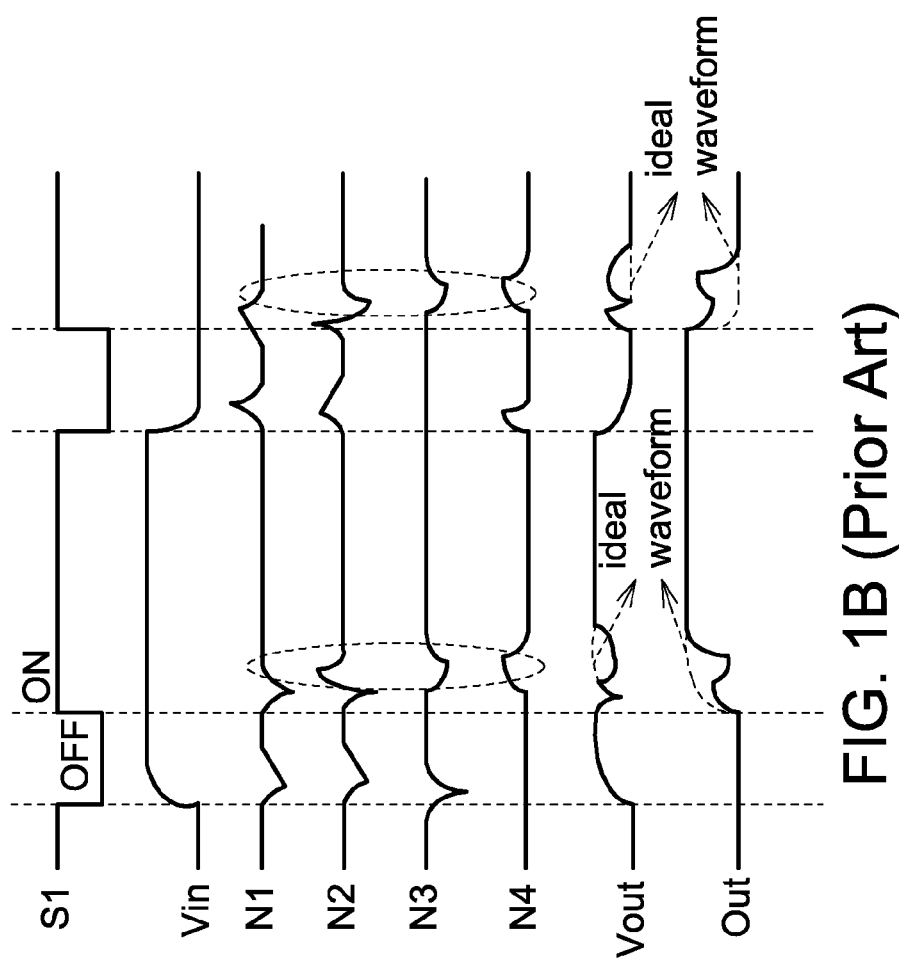
FIG. 1B shows a signal timing diagram of the amplifier circuit of FIG. 1A.

During the level transition period when the input voltage Vin changes to a high level from a low level, the switch element S1 changes to the turned-on state from the turned-off state, and the output voltage Vout also changes to a high level from a low level. The transient level change of the output voltage Vout will be coupled to the second feedback node N2 through the second phase compensation circuit 208, so that the voltage (that is, Vn2) at the second feedback node N2 will be boosted. When the difference between the voltage Vn2 at the second feedback node N2 and the voltage Vn6 at the second coupling node N6 is larger than the turn-on voltage Vt at the PN diode D5, the PN diode D5 will be turned on to generate a compensation current. The compensation current speeds up the discharging response at the second feedback node N2, but suppresses the voltage boosting at the second feedback node N2. As a result, the transistor M12 will not be turned off like in the prior art illustrated in FIG. 1A, so the output voltage Vout will be free of the abnormal state illustrated in FIG. 1B.

Likewise, during the level transition period when the input voltage Vin changes to a low level from a high potential, the switch element S1 changes to the turned-on state from the turned-off state, and the output voltage Vout also changes to a low potential from a high potential. The transient level change of the output voltage Vout will be coupled to the first feedback node N1 through the first phase compensation circuit 206, so that the voltage (that is, Vn1) at the first feedback node N1 will be lowered down. When the difference between the voltage Vn1 at the first feedback node N1 and the voltage Vn5 at the first coupling node N5 is larger than the turn-on voltage Vt at the PN diode D6, the PN diode D6 will be turned on to generate a compensation current. The compensation current speeds up the charging response at the first feedback node N1, but suppresses the voltage drop at the second feedback node N2. As a result, the transistor M10 will not be turned off like in the prior art illustrated in FIG. 1A, so the output voltage Vout is free of the abnormal state illustrated in FIG. 1B.

In the above disclosure, the first and the second coupling suppression devices 210 and 212 are respectively implemented by a single diode D4 and a single D5. However, the above disclosure is for exemplification only not for limiting the scope of the invention. For example, in other embodiments, the first and the second coupling suppression devices 210 and 212 can have other numbers of diodes, or be implemented by various electronic elements in different connection ways or a combination thereof.

For example, the first and the second coupling suppression devices 210 and 212 include a plurality of serially-coupled PN diodes respectively. Moreover, the first and the second coupling suppression devices 210 and 212 respectively can be implemented by a diode-connected transistor formed by one or a number of serially-coupled diodes. The adopted transistor can be implemented by a field-effect transistor such as a metal-oxide-semiconductor field-effect transistor (MOSFET) or a metal semiconductor field-effect transistor (MESFET), wherein the gate is connected to the source/drain (the turn-on voltage is equal to the threshold voltage), or can be implemented by a junction transistor such as a bipolar junction transistor (BJT).

Figure 2B:
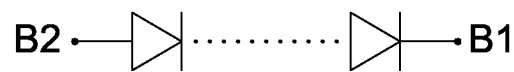
FIG. 2B shows other embodiments of circuit structural diagrams of the first and the second coupling suppression devices of FIG. 2A.
Figure 2B:
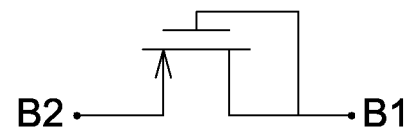
Figure 2B:
Figure 2B:
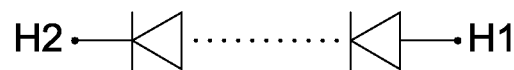
Figure 2B:
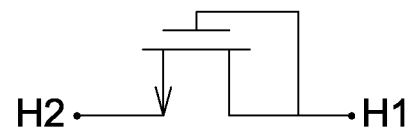
Figure 2B:
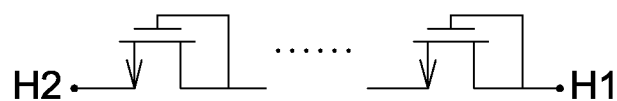
Figure 2C:
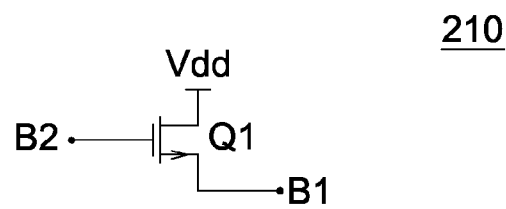
FIG. 2C shows a circuit structural diagram of the first and the second coupling suppression devices of FIG. 2A, which are implemented by transistor elements.
Figure 2C:
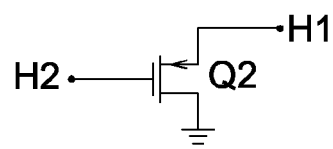
Figure 2D:
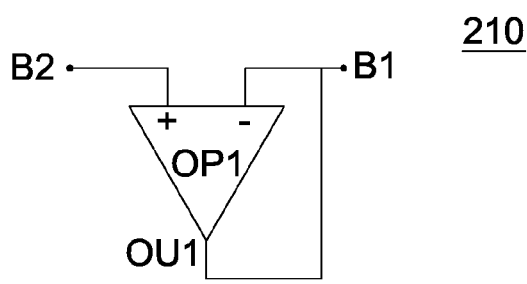
FIG. 2D shows a circuit structural diagram of the first coupling suppression element and the second coupling suppression device of FIG. 2A, which are implemented by operational amplifiers.
Figure 2D:
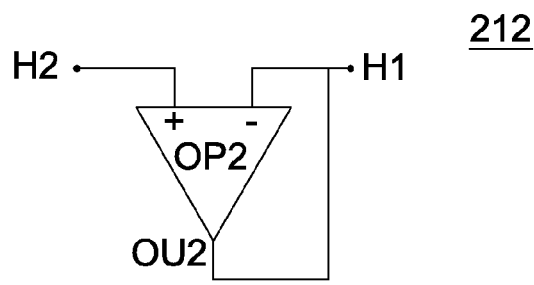

Besides, the first and the second coupling suppression devices 210 and 212 as implemented by a transistor element can have other connection types. As indicated in FIG. 2C, the first coupling suppression device 210 is such as an NMOS transistor Q1 having a source coupled to the first feedback node N1, a gate coupled to the first coupling node N5, and a drain coupled to the first operating voltage Vdd. Likewise, the second coupling suppression device 212 is such as a PMOS transistor Q2 having a source coupled to the second feedback node N2, a gate coupled to the second coupling node N6, and a drain coupled to the second operational voltage GND. When the voltage difference between the gate (B2) and the source (B1) of the transistor Q1 or the voltage difference between the source (H1) and the gate (H2) of the transistor Q2 is larger than a threshold voltage, the transistor Q1 or Q2 is turned on. In addition, the MOS transistor can be replaced by other types of transistor such as a bipolar junction transistor.

In another alternative embodiment, the first and the second coupling suppression devices 210 and 212 can respectively be implemented by an operational amplifier. As indicated in FIG. 2B, the first coupling suppression device 210 is such as an operational amplifier OP1 having a first input end coupled to the first feedback node N1, a second input end coupled to the first coupling node N5, and an output end (OU1) coupled to the first input end. Likewise, the second coupling suppression device 212 is such as an operational amplifier OP2 having a first input end coupled to the second feedback node N2, a second input end coupled to the second coupling node N6, and an output end (OU2) coupled to the first input end.

To summarize, the first and the second coupling suppression devices 210 and 212 can be implemented by any electronic elements or devices that are not turned on when the amplifier device is in normal operation but are spontaneously turned on in response to change of a voltage level at the corresponding feedback node to generate a compensation current to suppress the voltage change at the first feedback node N1 and the second feedback node N2 caused by noise coupling so as to avoid abnormal output and abnormal current leakage.

It is noted that despite the first and the second coupling nodes of the first embodiment are exemplified by the nodes N5 and N6, the invention is not limited thereto. In other embodiments, each of the first and the second coupling nodes can be implemented by any node inside the amplifier device with a voltage level close to the DC level of the feedback node, and the details are elaborated in the second embodiment below.

Second Embodiment

Figure 3:
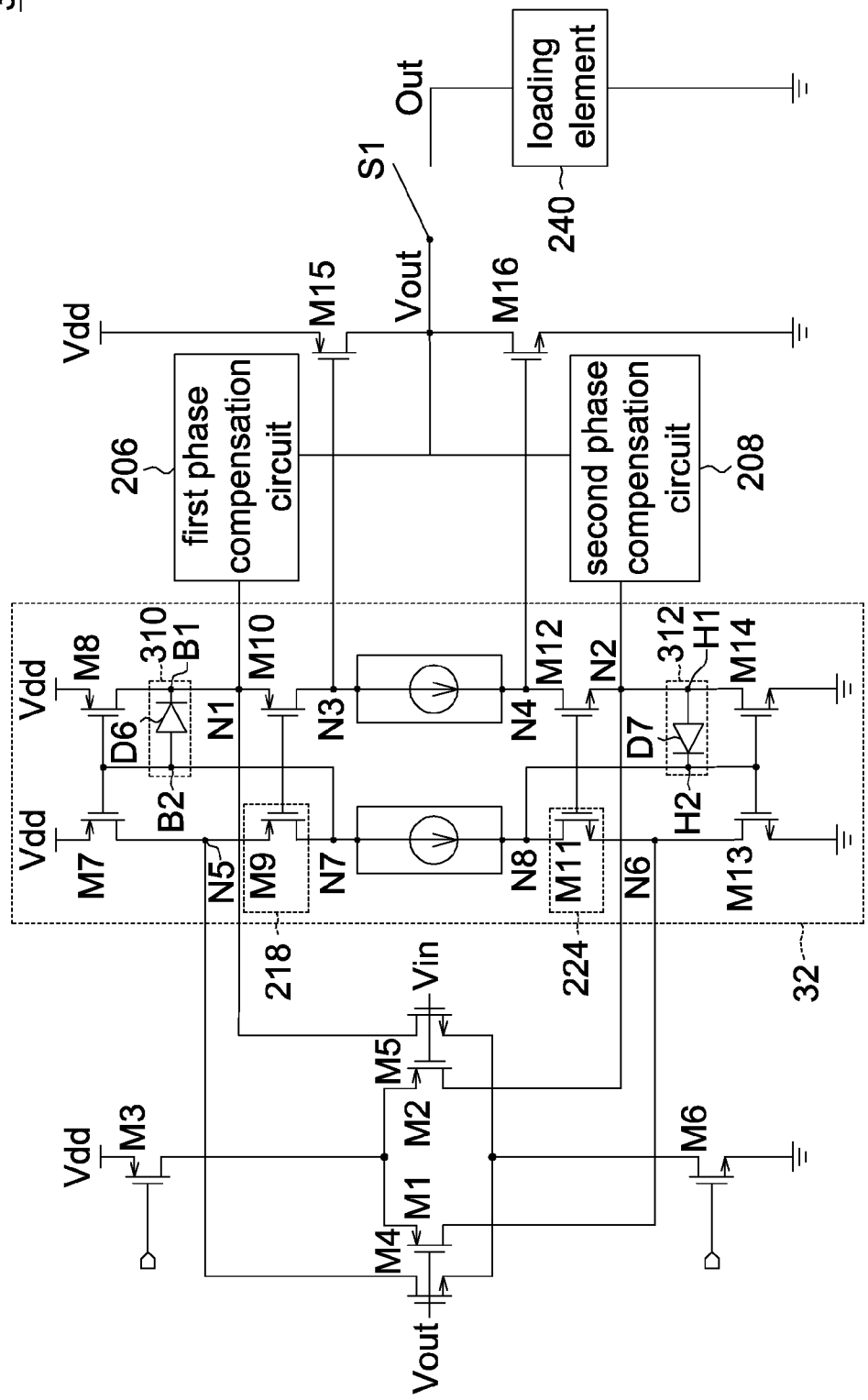
FIG. 3 shows a block structure and detailed circuit diagram of an amplifier device according to a second embodiment.

Referring to FIG. 3, a block structure and detailed circuit diagram of an amplifier device according to a second embodiment is shown. As indicated in FIG. 3, the amplifier device 300 of the second embodiment is different from the amplifier device 200 of the first embodiment in that the first and the second coupling nodes are respectively replaced by the node N7 of the third switch 218 (that is, the drain of the transistor M9) and the node N8 of the sixth switch 224 (that is, the drain of the transistor M11).

Under such arrangement, when the operation of the amplifier device 300 is normal and in DC response, the voltage drop between the first and the second coupling suppression devices 310 and 312 is still smaller than the turn-on voltage, so the amplifier device 300 is not turned on and does not affect the normal operation. To the contrary, during the conversion when the input voltage Vin changes to a low level from a high level or changes to a high level from a low level, the first or the second coupling suppression device 310 or 312 is turned on, and the voltage change at the first or the second coupling node N1 or N2 is suppressed.

In the present embodiment, the first and the second coupling suppression devices 310 and 312 are exemplified by diodes D6 and D7. However, in other embodiments, the first and the second coupling suppression devices 310 and 312 can respectively include a plurality of serially-coupled diodes, or one or a number of transistor elements formed by diodes or in other connection types, or an operational amplifier. Other circuit structure and operation of the amplifier device 300 are similar to that of the amplifier device 200, and are not repeated here.

Third Embodiment

Figure 4:
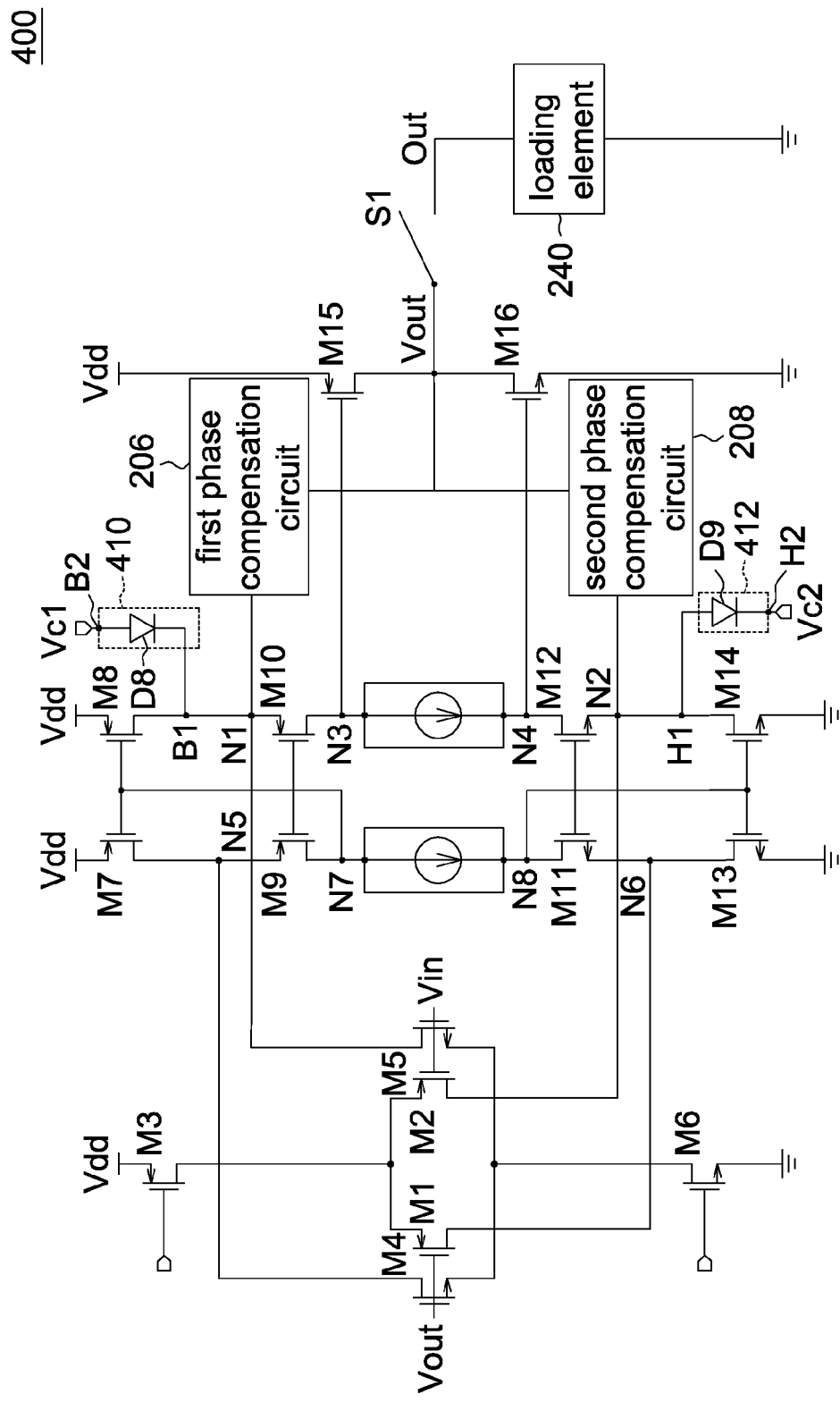
FIG. 4 shows a block structure and detailed circuit diagram of an amplifier device according to a third embodiment.

Referring to FIG. 4, a block structure and detailed circuit diagram of an amplifier device according to a third embodiment is shown. As indicated in FIG. 4, the amplifier device 400 of the third embodiment is different from the amplifier device 200 of the first embodiment mainly in that the first coupling node is replaced by an external DC voltage node (that is, B2) coupled to a first DC voltage Vc1, and the second coupling node is replaced by an external DC voltage node (that is, H2) coupled to a second DC voltage Vc2. Other details of the amplifier device 400 are similar to that of the amplifier device 200, and are not repeated here.

In order not to affect the normal operation of the amplifier device 400, the first DC voltage Vc1 is designed to satisfy that the absolute value of the difference between the first DC voltage Vc1 and the DC voltage at the first feedback node N1 is smaller than the turn-on voltage of the first coupling suppression device 410, and the second DC voltage Vc2 is designed to satisfy that the absolute value of the difference between the second DC voltage Vc2 and the DC voltage at the second feedback node N2 is smaller than the turn-on voltage of the second coupling suppression device 420.

In the present embodiment, the first and the second coupling suppression devices 410 and 412 are exemplified by diodes D8 and D9. However, in other embodiments, the first and the second coupling suppression devices 410 and 412 can respectively include a plurality of serially-coupled diodes, or one or a number of transistor elements formed by diodes or in other connection types, or an operational amplifier. Other circuit structure and operation of the amplifier device 400 are similar to that of the amplifier device 200, and are not repeated here.

In the exemplification of the above embodiments, one end of the coupling suppression device is coupled to a feedback node of the phase compensation circuit, and the other end of the coupling suppression is coupled to a coupling node with a voltage level close to the DC level of the feedback node (such as an internal inherent node of the circuit or an external DC voltage node). However, the invention is not limited to the above embodiments. Any design is within the scope of protection of the invention as long as it prevents the voltage level coupled to the coupling suppression device from affecting the normal operation of the amplifier device in the DC response, and allows the coupling suppression device to suppress changes of the voltage level at the feedback node when the noise is coupled to the feedback node through the phase compensation circuit.

To summarize, when the amplifier device is in the normal operation, the coupling suppression device is not turned on so as not to affect the normal operation of the amplifier device. However, when the amplifier device has noise coupled to the phase compensation circuit so as to change the voltage level at the feedback node, the coupling suppression device is spontaneously turned on for providing a compensation current which can suppress the voltage change at the feedback node. Consequently, the above embodiments effectively avoid the occurrence of abnormal output waveform and abnormal current leakage and thus increase the quality of the output signal.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An amplifier device, comprising:
    a gain stage having at least one feedback node;
    an output stage coupled to the gain stage, wherein the output stage has an output node for outputting an output voltage;
    at least one phase compensation circuit each being coupled between a corresponding one of the at least one feedback node of the gain stage and the output node; and
    at least one coupling suppression device each being coupled between a corresponding one of the at least one feedback node of the gain stage and a respective coupling node and being spontaneously turned on in response to a change of a voltage level at the corresponding feedback node when the corresponding feedback node is coupled by noise, so that the change of the voltage level at the corresponding feedback node is suppressed.

2. The amplifier device according to claim 1, wherein the noise is coupled from the output node through the phase compensation circuit to the corresponding feedback node.

3. The amplifier device according to claim 1, further comprises an input stage having a plurality of input nodes, wherein one of the input nodes is coupled to the output node.

4. The amplifier device according to claim 1, wherein the noise occurs during a level transition period of the output voltage.

5. The amplifier device according to claim 1, wherein if a voltage difference between the corresponding feedback node and the respective coupling node is larger than or equal to a predetermined voltage, the coupling suppression device is turned on, otherwise the coupling suppression device is turned off.

6. The amplifier device according to claim 1, wherein after the voltage level of the corresponding feedback node is boosted to turn on the coupling suppression device, the coupling suppression device forms a discharging path through which a compensation current flows for discharging the corresponding feedback node.

7. The amplifier device according to claim 1, wherein after the voltage level of the corresponding feedback node is lowered down to turn on the coupling suppression device, the coupling suppression device forms a charging path through which a compensation current flows for charging the corresponding feedback node.

8. The amplifier device according to claim 1, wherein a DC voltage level of the respective coupling node is substantially equal to a DC voltage level of the corresponding feedback node.

9. The amplifier device according to claim 1, wherein the respective coupling node of each of the at least one coupling suppression device is either of an internal inherent node and an external DC voltage node of the amplifier device.

10. The amplifier device according to claim 1, wherein each of the at least one coupling suppression device comprises at least one of one or more serially-coupled diode elements, one or more serially-coupled transistors, and an operational amplifier.

11. The amplifier device according to claim 1, wherein the output stage further comprises a first output switch coupled to the output node, and the gain stage further comprises:
    a first switch, comprising:
        a first end coupled to a control end of the first output switch;
        a second end coupled to the corresponding feedback node;
    a second switch, comprising:
        a first end coupled to the second end of the first switch; and
        a second end coupled to a first operating voltage; and
    a third switch, comprising:
        a first end coupled to a control end of the second switch; and
        a control end coupled to a control end of the first switch.

12. The amplifier device according to claim 11, wherein the respective coupling node is coupled to one of the first end and a second end of the third switch.

13. The amplifier device according to claim 11, wherein the first output switch is a P-type metal oxide semiconductor (PMOS) transistor, the coupling suppression device comprises a diode element, a cathode of the diode element is coupled to the corresponding feedback node, and an anode of the diode element is coupled to the respective coupling node.

14. The amplifier device according to claim 11, wherein the first output switch is an N-type metal oxide semiconductor (NMOS) transistor, the coupling suppression device comprises a diode element, a cathode of the diode element is coupled to the corresponding feedback node, and an anode of the diode element is coupled to the respective coupling node.

15. The amplifier device according to claim 11, wherein the coupling suppression device comprises a transistor element having a first end coupled to the corresponding feedback node, a control end coupled to the respective coupling node, and a second end coupled to an operational voltage.

16. The amplifier device according to claim 1, wherein the coupling suppression device comprises an operational amplifier having a first input end coupled to the corresponding feedback node, a second input end coupled to the respective coupling node, and an output end coupled to the first input end.

* * * * *